United States Patent

LaMacchia et al.

[11] Patent Number: 5,949,248
[45] Date of Patent: Sep. 7, 1999

[54] APPARATUS AND METHOD FOR DYNAMIC HARDENING OF A DIGITAL CIRCUIT

[75] Inventors: Michael Philip LaMacchia, Gilbert; William Oliver Mathes, Tempe; Bruce Alan Fette, Mesa, all of Ariz.

[73] Assignee: Motorola Inc., Schaumburg, Ill.

[21] Appl. No.: 08/943,021

[22] Filed: Oct. 2, 1997

[51] Int. Cl.$^6$ .................... H03K 19/003; H03K 17/16
[52] U.S. Cl. .................... 326/9; 326/21; 326/22
[58] Field of Search ................. 326/21, 22, 23, 326/9, 11

[56] References Cited

U.S. PATENT DOCUMENTS

| | | | |
|---|---|---|---|
| 4,614,884 | 9/1986 | Nagano | 326/22 |
| 5,418,473 | 5/1995 | Canaris | 326/27 |
| 5,600,260 | 2/1997 | LaMacchia et al. | 326/11 |

*Primary Examiner*—Michael Tokar
*Assistant Examiner*—Daniel D. Chang
*Attorney, Agent, or Firm*—Gregory J. Gorrie

[57] ABSTRACT

A single event upset (SEU) sensitivity control system (42) dynamically hardens a digital circuit (48) to single event upsets. The sensitivity control system (42) includes an upset rate sensor (66) for detecting a quantity of particles (38) that cause single event upsets. A noise margin control circuit (70) is configured to adjust a noise margin (46) of the digital circuit (48) in response to the quantity of particles (38). Noise margin (46) is increased when a particle density (34) is high to decrease the sensitivity of the digital circuit (48) to single event upsets. Additionally, noise margin (46) is decreased when a particle density (36) is low to decrease the power consumption level of digital circuit (48).

24 Claims, 3 Drawing Sheets

APPARATUS AND METHOD FOR DYNAMIC HARDENING OF A DIGITAL CIRCUIT

FIELD OF THE INVENTION

This invention relates in general to the field of single event upset (SEU) hardening of digital circuits, and in particular to dynamically SEU hardening a digital circuit.

BACKGROUND OF THE INVENTION

Single event upsets (SEUs), or soft errors, are a problem in digital circuits located in environments that contain large numbers of particles that are likely to cause SEUs. An SEU occurs when particles, such as protons and heavy ions, passing through a digital circuit deposit enough charge to upset the logic state of the circuit. The susceptibility of high speed digital circuits to SEUs is due to the very fast nature of the SEU. The time scale for the deposition of the charge is typically about fifty picoseconds to three nanoseconds. This susceptibility is proportional to technology bandwidth indicating increased sensitivity with advances in technology. Standard silicon CMOS technology is becoming increasingly sensitive with reducing gate lengths.

Most very high speed logic is implemented in current steering logic (CSL). CSL implements Boolean functions by steering a current through differential transistor pairs to develop a differential output voltage across resistive devices, and incorporates current amplifiers, such as source or emitter followers, when increased drive capability is needed. CSL is the basis for silicon emitter-coupled logic (ECL) and current mode logic (CML), gallium arsenide (GaAS) source coupled FET logic (SCDL), some GaAs hetero-structure bipolar transistor (HBT) circuits, and can be found in other semiconductors and associated logic implementations.

Conventional SEU hardening approaches rely upon either system level triple modular redundancy coupled with voting logic circuitry or RF filtering to reduce bandwidth. A shortcoming of system level triple modular redundancy is the greater than 300% increase in complexity and power as well as increases in size and weight required in order to provide the hardening function. Furthermore, extensive redesign to existing systems is needed to incorporate the system level triple modular redundancy in order to implement SEU hardening. One shortcoming of RF filtering is the reduction of system speed.

One SEU hardening approach overcomes the shortcomings of the system level triple modular redundancy through functional redundancy at the transistor level by including three or more functionally equivalent circuit cell elements in parallel. SEU insensitive resistive devices are used in a summing element. If the cell is clocked, three or more clock distribution circuits are used for clock hardening. The function of the multiple circuit cell elements is such that an SEU is not sufficient to cause a logic error in the circuit output.

The parallel circuit cell element approach obtains a similar level of soft error hardening as the system level triple modular redundancy approach without the added complexity of voting logic circuitry and with less circuit area. Furthermore, it is implemented within an integrated circuit to allow "drop-in" replacement resulting in little system modification, and no integrated circuit fabrication process modifications. However, a problem exists with the parallel circuit cell element approach in that it has an undesirably high power consumption level, though less sensitive than triple modular redundancy.

Power consumption is an important factor in some applications, such as spacecraft systems, because increased power consumption results in the need to generate more power and the need to carry away more heat. Additional power consumption and heat dissipation elements result in a greater weight and complexity of the spacecraft which ultimately drives up system costs. Hence, prior art systems are typically designed to desirably minimize power consumption levels. Unfortunately, operating digital circuits at lower power consumption levels adversely affects the sensitivity of digital circuits to SEUs causing the digital circuit to suffer from unacceptably high numbers of SEUs.

Thus what is needed is an apparatus and method for dynamic SEU hardening of a digital circuit that does so efficiently and simply. Furthermore, what is needed is a method and apparatus that operates at the lowest power possible in a given environment and can be implemented within pre-existing circuitry, such as a spacecraft, with little system modification. In addition, what is needed is an apparatus that can be used in applications with varying SEU hardening needs in which an SEU adjustment variable is adjusted in response to the varying SEU hardening needs.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

Figure 1:
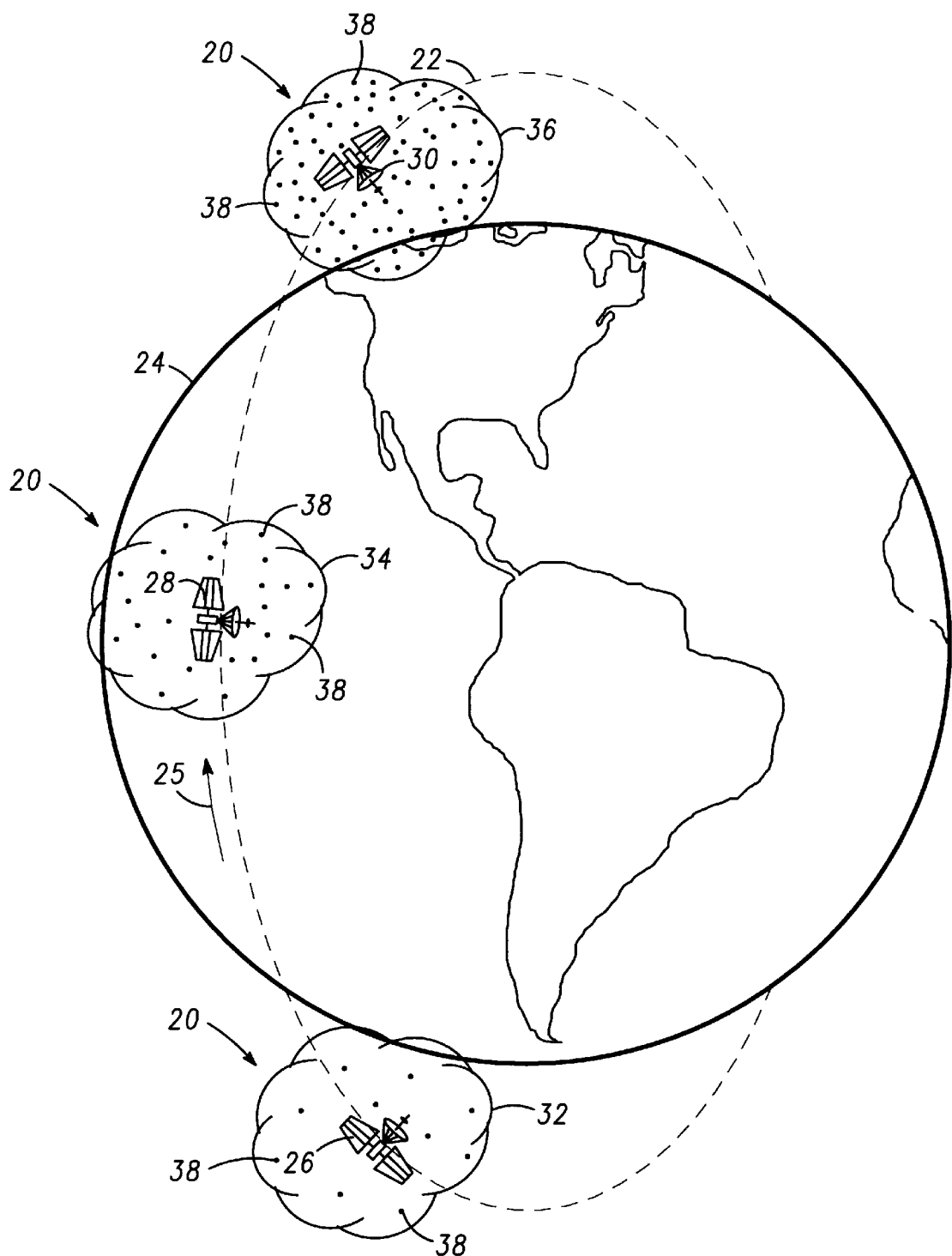
FIG. 1 shows an illustration of a spacecraft system in an orbit around the earth in accordance with a preferred embodiment of the present invention.

FIG. 1 shows an illustration of a spacecraft system 20 traveling in an orbit 22 around a celestial body, such as the earth 24, in accordance with a preferred embodiment of the present invention. As shown by the direction of an arrow 25, spacecraft 20 is shown traveling to a first position 26, followed by a second position 28, and then followed by a third position 30. First position 26 exhibits a first particle density 32. Likewise, second position 28 exhibits a second particle density 34 and third position 30 exhibits a third particle density 36.

As spacecraft 20 travels through orbit 22, the flux rate of particles 38, such as protons and heavy ions, that are likely to cause single event upsets (SEUs) can vary widely. First, second, and third particle densities 32, 34, and 36, respectively are proportional to a quantity of particles 38 in a given volume. SEU inducing particle densities not only vary between orbits, but can also change significantly at different positions in orbit 22. Therefore, each of first, second, and third positions 26, 28, and 30, respectively, have first, second, and third particle densities, 32, 34, and 36, respectively, that are unequal. In addition, first, second, and third particle densities, 32, 34, and 36, may vary significantly as a function of solar weather, such as solar flares.

Spacecraft 20 includes digital logic circuits (discussed below) that are sensitive to SEUs. The present invention reduces the effects of SEUs to the logic states of the digital logic circuits by reducing the sensitivity of the digital circuits to the SEUs, or SEU hardening the digital circuits. Furthermore, the present invention recognizes the different flux rates, caused by the density of the particles at different positions in an orbit, and adjusts the SEU sensitivity dynamically relative to the flux rates.

Figure 2:
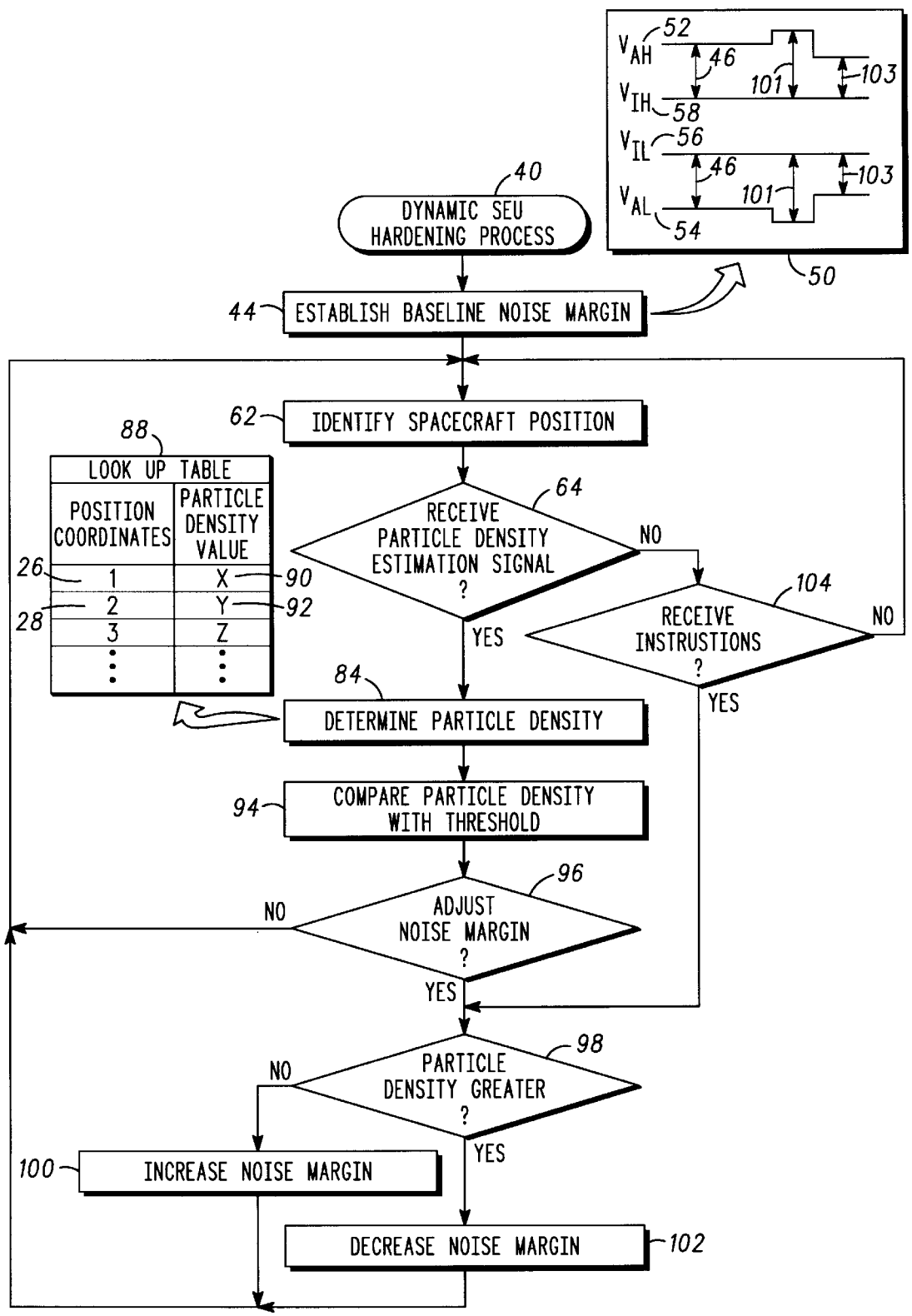
FIG. 2 shows a flow chart of a dynamic single event upset (SEU) hardening process in accordance with a preferred embodiment of the present invention.
Figure 3:
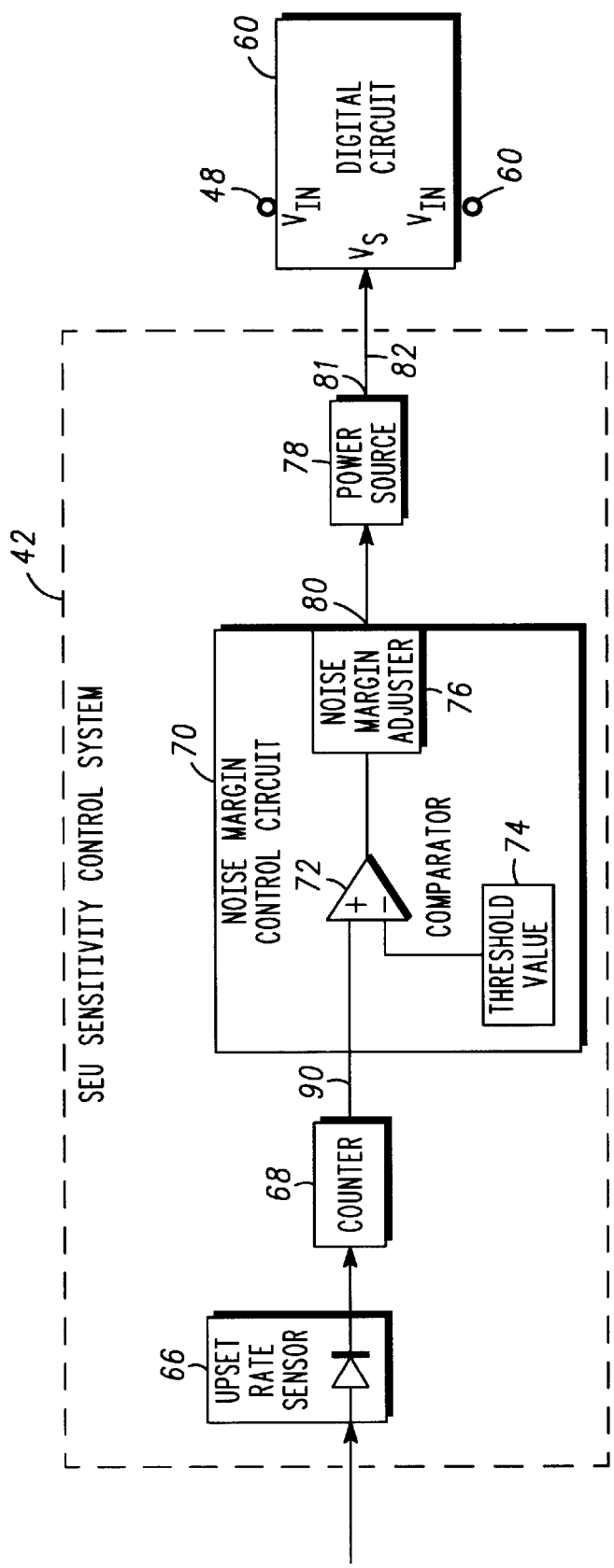
FIG. 3 shows a block diagram of a single event upset (SEU) sensitivity control system in accordance with a preferred embodiment of the present invention.

FIG. 2 shows a flow chart of a dynamic single event upset (SEU) hardening process 40 and FIG. 3 shows a block diagram of a single even upset (SEU) sensitivity control system 42 in accordance with a preferred embodiment of the present invention. In the preferred embodiment, process 40 is performed in conjunction with the operation of spacecraft system 20 (FIG. 1). However, nothing in the present invention limits process 40 or SEU sensitivity control system 42 to spacecraft applications. Process 40 and system 42 may be implemented in other applications where SEU hardening is desired, such as in aircraft, in laboratory testing, and so forth.

Referring to FIGS. 2–3, process 40 begins with a task 44. Task 44 establishes a baseline noise margin 46 for a digital circuit 48. Digital circuit 48 may be a complementary metal-oxide semiconductor (CMOS) element. Alternatively, digital circuit 48 may be a current steering logic (CSL) element, such as silicon emitter-coupled logic (ECL), current mode logic (CML), gallium arsenide (GAAS) source coupled FET logic (SCFL), or a GaAs hetero-structure bipolar transistor (HBT) circuit. To clarify the following description, noise margin 46 is described in connection with a CMOS element, however, those skilled in the art will readily adapt the following discussion to current steering logic as well.

A window 50, associated with task 44 in FIG. 2, illustrates some exemplary characteristics of digital circuit 48. An input voltage, $V_{AH}$ 52 represents the average input voltage for a high input logic state in digital circuit 48. Likewise, an input voltage, $V_{AL}$ 54 represents the average voltage level for a low input logic state in digital circuit 48. Input voltages 52 and 54 are known characteristics of digital circuit 48 and are related to power supply voltages. An input low voltage, $V_{IL}$ 56 represents an industry standardized maximum voltage recognized as a low state for digital circuit 48. Likewise, an input high voltage, $V_{IH}$ 58 represents an industry standardized minimum voltage recognized as a high state.

The difference between input low voltage, $V_{IL}$ 56 and input voltage, and the switching threshold of the device $V_{AH}$ 54 is noise margin 46. Likewise, the difference between input high voltage, $V_{IH}$ 58 and input voltage, $V_{AH}$ 52 is noise margin 46. Noise margin 46 is defined as the instantaneous voltage offset that can be impressed upon an input voltage at any (or all) logic input/output terminals 60 of digital circuit 48 without upsetting the logic state. For CMOS and other digital circuits, noise margin 46 is adjusted by adjusting the source voltage (described below) provided to power or energize digital circuit 48.

A discovery has been made by which the sensitivity of digital circuit 48 to SEUs has been found to be proportional to the size of noise margin 46. Furthermore, the size of noise margin 46 is proportional to the amount of voltage provided by the source voltage. In other words, increasing noise margin 46 decreases the sensitivity of digital circuit 48 to SEUs. However, a higher voltage level from the source voltage is used and power consumption of digital circuit 48 is increased. Likewise, decreasing noise margin 46 increases the sensitivity of digital circuit 48 to SEUs, and power consumption of digital circuit 48 is decreased.

The present invention, adjusts noise margin 46 in response to the quantity of particles 38 (FIG. 1) in a given volume, or particle density. In an area having a high particle density, noise margin 46 is increased to decrease the sensitivity of digital circuit 48 to SEUs at a cost of higher power consumption. However, in an area having a low particle density, noise margin 46 is decreased which decreases power consumption of digital circuit 48. Hence, SEU sensitivity is adjusted dynamically to achieve SEU hardening of digital circuit 48 while effectively controlling power consumption levels of digital circuit 48.

Task 44 establishes a baseline noise margin 46 by referencing known specifications of digital circuit 48. Task 44 is desirably performed in the design and manufacture stage of spacecraft 20 (FIG. 1) in a manner which is conventional in the design of digital circuits. Following task 44, other tasks are performed (not shown) that are pertinent to the manufacture and launch of spacecraft 20 so that spacecraft 20 travels around earth 24 (FIG. 1) in orbit 22 (FIG. 1).

Following task 44 and after spacecraft 20 is traveling around earth 24 in orbit 22, a task 62 is performed. Task 62 identifies spacecraft position in orbit 22. In a particular illustration, spacecraft 20 is at first position 26 (FIG. 1). First position 26 of spacecraft 20 may be defined with coordinates relative to earth 24. Those skilled in the art will recognize that there are any number of ways to define first position 26.

In response to task 62, at query task 64 determines if a particle density estimation signal is received. The particle density estimation signal is generated onboard spacecraft 20. In the preferred embodiment, the particle density estimation signal is received by, and activates, SEU sensitivity control system 42. SEU sensitivity control system 42, located onboard spacecraft 20, is configured to dynamically SEU harden digital circuit 48 by adjusting noise margin 46.

With particular reference to FIG. 3, SEU sensitivity control system 42 includes an upset rate sensor 66 for detecting a quantity of particles 38 (FIG. 1) that are likely to cause single event upsets. Upset rate sensor 66 is an SEU unhardened circuit with well known SEU characteristics. In the preferred embodiment, upset rate sensor 66 is a commonly used Positive-Intrinsic-Negative (PIN) diode. However, upset rate sensor 66 may be any number of devices that respond in a sensitive manner to particles 38 (FIG. 1). For example, other suitable sensors include silicon or GaAs shift registers, unhardened devices characterized and configured for error counting, and custom ASIC devices designed to detect errors.

SEU sensitivity control system 42 also includes a counter 68 coupled between upset rate sensor 66 and a noise margin control circuit 70. Counter 68 is configured to calculate and output a first value 90 representative of a particle density from a quantity of particles 38 that are detected by upset rate sensor 66. First value 90 is illustrated as a line leaving counter 68 and directed to a noise margin control circuit 70. However, it should be realized that first value 90 is an electrical signal carried by a medium, such as a wire between counter 68 and noise margin control circuit 70.

Noise margin control circuit 70 is configured to adjust noise margin 46 at each of first, second, and third positions 26, 28, and 30, respectively. First value 90 generated by counter 68 is input into a comparator 72 of noise margin control circuit 70. Comparator 72, coupled to counter 68, is configured to compare first value 90 corresponding to the particle density in a first position with a threshold value 74 corresponding to a predetermined particle density.

A noise margin adjuster 76 of noise margin control circuit 70 is coupled to comparator 72 and receives a comparison output from comparator 72. Noise margin adjuster 76 is configured to impart a desired change to noise margin 46 (FIG. 2) in response to the comparison output from comparator 72. Such a desired change may be to increase noise margin 46 in a high particle density environment to decrease the sensitivity of digital circuit 48 to SEUs. Alternatively, a desired change may be to decrease noise margin 46 in a low particle density environment which increases the sensitivity of digital circuit 48 to SEUs, but decreases the power consumption of digital circuit 48.

A power source 78 is coupled to an adjuster output 80 of noise margin adjuster 76. Power source 78 has an output 81 configured to provide a source voltage, $V_s$, 82 to digital circuit 48 in response to the desired change. Source voltage 82 is illustrated as a line leaving power source 78 and directed to digital circuit 48, however, it should be realized that source voltage 82 is carried by a medium such as wire that is connected between power source 78 and digital circuit 48.

When digital circuit 48 is a CMOS element, power source 78 is a voltage source (e.g. a voltage regulator) for providing source voltage 82 to digital circuit 48. Noise margin 46 is responsive to source voltage 82 so that noise margin adjuster 76 alters source voltage 82 to affect a desired change to noise margin 46. Likewise, if digital circuit 48 is a current steering logic (CSL) element, power source 78 is a voltage source for providing a current source bias voltage to digital circuit 48 to affect a desired change to noise margin 46, such as increasing or decreasing noise margin 46 in response to the particle density at a particular position.

Power source 78 provides power to digital circuit 48, so that noise margin 46 is proportional to a power consumption level of digital circuit 48. Therefore, noise margin adjuster 76 alters the power consumption level of digital circuit 48 which results in the SEU sensitivity being tuned to the current SEU sensitivity needed to achieve overall efficient power utilization. This reduces the burden of continuously generating sufficient power from solar panels and sufficient heat dissipation to meet momentary worst case SEU sensitivity needs. As a consequence, weight, complexity, and system costs are reduced.

Referring back to FIG. 2, if a particle density estimation signal is received in query task 64, process 40 proceeds to a task 84. Task 84 determines particle density by counting a signal which is proportional to particles 38 (FIG. 1) in a given volume. In the illustration described above, spacecraft 20 is in first position 26. SEU sensitivity control system 42, located onboard spacecraft 20, detects particles 38 in first position 26 and calculates a first value representative of first particle density 32 (FIG. 1).

In an alternate embodiment, in response to identification of spacecraft position in task 62 and receipt of a particle density estimation signal in query task 64, task 84 is performed by accessing a look-up table 88. In the alternate embodiment, look-up table 88 replaces upset rate sensor 66 (FIG. 3) and counter 68 (FIG. 3). In one embodiment, look-up table 88 is augmented with a user defined multiplier or scaling factor. This scaling factor is preferably controllable from the ground during the spacecraft's orbit.

Prior to initiation of process 40, particle densities at a plurality of positions are determined for orbit 22 (FIG. 1). For example, first position 26 has a first value 90 stored in look-up table 88 that is responsive to first particle density 32. Likewise, second position 28 has a second value 92 that is responsive to second particle density 34, and so forth. The characterization of orbit 22 is performed by determination of known levels of particles 38 (FIG. 1) in particular positions about earth 24 (FIG. 1) or characterization takes place when spacecraft 20 (FIG. 1) travels along orbit 22 for the first time.

In response to identification of spacecraft position in task 62, look-up table 88 is accessed just prior to the arrival of spacecraft system 20 to first position 26 to obtain first value 90. Likewise, look-up table 88 is accessed just prior to the arrival of spacecraft system 20 to second position 28 to obtain second value 90.

Following task 84, a task 94 compares first value 90, stored in look-up table 88 or calculated by counter 68 (FIG. 3), with threshold value 74 (FIG. 2). In the preferred embodiment, threshold value 74 is proportional to a previous particle density, so that noise margin 46 is adjusted relative to a change in particle densities.

In connection with task 94, a query task 96 determines if noise margin 46 should be adjusted. Noise margin 46 may need no adjustment if a difference between first value 90 and threshold value 74 is not significant. This significance is based on predetermined requirements for digital circuit 48, such as functional criticality of digital circuit 48. When query task 96 determines that noise margin 46 need not be adjusted, process control loops back to task 62 to identify spacecraft position and particle density as spacecraft 20 travels through and repeats orbit 22 (FIG. 1).

When query task 96 determines that first value 90 differs significantly from threshold value 74, a query task 98 determines if first value 90 is greater than threshold value 74. Referring to the example illustrated in FIG. 1, spacecraft 20 is traveling from first position 26, having first particle density 32, to second position 28, having second particle density 34. Therefore, threshold value 74 is a value responsive to first particle density 32. In the example, second particle density 34 is greater than first particle density 32 so a task 100 is performed.

Task 100 increases noise margin 46 of digital circuit 48 (FIG. 3) as spacecraft 20 travels from first position 26 (FIG. 1) to second position 28 (FIG. 1). Noise margin adjuster 76 (FIG. 3) increases noise margin 46 to an increased noise margin 101 by increasing source voltage 82 (FIG. 3) to digital circuit 48. Increased noise margin 101 widens the band of voltage for which an SEU induced voltage can be impressed upon an input voltage, $V_{in}$, at logic input/output terminals 60 of digital circuit 48 without upsetting the logic state. In other words, digital circuit 48 now exhibits decreased sensitivity to SEUs, but that decreased sensitivity comes at a price of increased power consumption.

Following task 100, program control loops back to task 62 to identify spacecraft position and make adjustments to increased noise margin 101 as spacecraft 20 travels through and repeats orbit 22 (FIG. 1).

When query task 98 determines that a value for particle density is not greater than threshold value 74, then a task 102 is performed. Task 102 decreases noise margin 46 of digital circuit 48. Once again, referring to the example illustrated in FIG. 1, spacecraft 20 is traveling from second position 28 having second particle density 34 to third position 30 having third particle density 36, so that threshold value 74 is a value responsive to second particle density 34 and noise margin 46 has been changed to increased noise margin 101. For purposes of this example, third particle density 36 is less than first particle density 32 and second particle density 34.

Task 102 decreases noise margin 46 of digital circuit 48 to a decreased noise margin 103 by decreasing source voltage 82 (FIG. 3) to digital circuit 48. Decreased noise margin 103 narrows the band of voltage for which an SEU induced voltage can be impressed upon an input voltage, $V_{IN}$, at logic input/output terminals 60 of digital circuit 48 without upsetting the logic state. In this example noise margin 103 is less than baseline noise margin 46 because third particle density 36 is less than first particle density 32. So, digital circuit 48 now exhibits increased sensitivity to SEUs, but this increased sensitivity can be tolerated because particle density is now lower. Moreover, lower power consumption is achieved along with the increased sensitivity. Following task 102, program control loops back to task 62 to identify spacecraft position and make further adjustments to decreased noise margin 103 as spacecraft 20 travels through and repeats orbit 22.

Referring back to task 64, when query task 64 determines that a particle density estimation signal generated in spacecraft 20 (FIG. 1) is not received, program control proceeds to a query task 104. Query task 104 determines if instructions are received for adjusting noise margin 46.

This spacecraft system 20 is also configured to receive instructions from a ground control to adjust noise margin 46 during periods of unexpected flux of particles 38 (FIG. 1). These instructions adjust noise margin 46 for digital circuit 48 (FIG. 3) to achieve the desired level of SEU hardening in a given particle environment. Instructions may be sent in response to unexpected changes in expected particle density in a given area such as changes that may occur during events such as solar flares. If query task 104 determines that instructions are received, process 40 proceeds to query task 98 to initiate adjustment of noise margin 46.

When instructions are not received at query task 104 process 40 loops back to task 62 to identify spacecraft position and re-adjust noise margin 46 accordingly as spacecraft 20 repeats orbit 22 (FIG. 1).

The net result of increasing task 100 and decreasing task 102 is to adjust noise margin 46 in response to a particular quantity of particles 38 (FIG. 1) in an environment. Power consumption level is a critical factor in space hardware because greater power consumption results in the necessity to generate more power from solar panels. Increasing noise margin 46 to decrease the sensitivity of digital circuit 48 to SEUs, increases the power consumption level of digital circuit. Decreasing noise margin 46 increases the sensitivity of digital circuit 48 to SEUs, but has the benefit of decreasing power consumption levels. So SEU hardening process 40 dynamically adjusts noise margin 46 so that digital circuit 48 becomes less sensitive to SEUs in high SEU causing particle environments and more sensitive to SEUs in low SEU causing particle environments. There is a lower probability of SEUS in digital circuit 48 in low particle environments, therefore power consumption savings can be achieved without significant adverse affects to digital circuit 48 because circuit 48 need not continuously consume power at a level which is consistent with a worst cast instantaneous SEU environment.

In summary, an SEU sensitivity control system and a method are provided for dynamic SEU hardening of a digital circuit. Three noise margin adjusting techniques have been described. A first technique includes onboard sensing using an SEU sensitivity control system. A second technique accesses an onboard lookup table. Finally, a third technique employs ground base commands. Dynamic SEU hardening of a digital circuit by adjusting the noise margin can be performed exclusively on any combination of one or more of these techniques so that dynamic SEU hardening is accomplished efficiently and simply.

Furthermore, the method and SEU sensitivity control system cause a digital circuit to operate at the lowest power possible in a given environment and can be implemented within preexisting circuitry, such as a spacecraft, with little system modification. In addition, SEU sensitivity control system can be used in applications with varying SEU hardening needs with a desirable variable being the adjustment of the noise margin prior to use.

Although the preferred embodiments of the invention have been illustrated and described in detail, it will be readily apparent to those skilled in the art that various modifications may be made therein without departing from the spirit of the invention or from the scope of the appended claims. For example, this dynamic SEU hardening technique may be used in connection with other SEU hardening techniques, such as triple redundancy, to achieve virtual immunity to SEUs.

What is claimed is:

1. A single event upset (SEU) sensitivity control system for dynamically SEU hardening a digital circuit, said digital circuit having a noise margin, and said control system comprising:

an upset rate sensor for detecting a quantity of particles that cause single event upsets; and a noise margin control circuit coupled to said upset rate sensor, said noise margin control circuit being configured to adjust said noise margin in response to said quantity of particles.

2. A sensitivity control system as claimed in claim 1 wherein said upset rate sensor is a Positive-Intrinsic-Negative (PIN) diode.

3. A sensitivity control system as claimed in claim 1 wherein said upset rate sensor is a Silicon or Gallium Arsenide shift register.

4. A sensitivity control system as claimed in claim 1 further comprising a counter coupled between said upset rate sensor and said noise margin control circuit, said counter being configured to calculate a particle density from said quantity of particles detected by said upset rate sensor.

5. A sensitivity control system as claimed in claim 4 wherein said control circuit comprises:

a comparator coupled to said counter, said comparator being configured to compare a first value corresponding to said particle density with a threshold value corresponding to a predetermined particle density;

a noise margin adjuster coupled to said comparator and having an adjuster output, said noise margin adjuster being configured to impart a desired change to said noise margin; and a voltage source coupled to said adjuster output and having an output connected to said digital circuit, said voltage source being configured to provide a source voltage to said digital circuit, said source voltage being adjusted by said noise margin adjuster in response to said desired change to said noise margin.

6. A sensitivity control system as claimed in claim 5 wherein:

said noise margin adjuster is configured to increase said noise margin when said first value is greater than said threshold value; and said noise margin adjuster is further configured to decrease said noise margin when said first value is less than said threshold value.

7. A sensitivity control system as claimed in claim 1 wherein:

said sensitivity control system is located in a spacecraft system;

said spacecraft system travels in an orbit;

said quantity of particles changes at each of a plurality of positions in said orbit; and said noise margin control circuit is configured to adjust said noise margin at each of said positions.

8. A method of operating a spacecraft system to dynamically single event upset (SEU) harden a digital circuit, said digital circuit being located in said spacecraft system, and said digital circuit having a noise margin, said method comprising the steps of:

determining a particle density in an orbit through which said spacecraft system travels, said particle density being proportional to a quantity of particles in a given volume that cause single event upsets (SEUs); and adjusting said noise margin in response to said particle density.

9. A method as claimed in claim 8 wherein:

said particle density at a first position in said orbit is a first particle density;

said particle density at a second position in said orbit is a second particle density, said second particle density being greater than said first particle density; and said method further comprises the step of increasing said noise margin of said digital circuit as said spacecraft system travels from said first position to said second position.

10. A method as claimed in claim 9 wherein:

said particle density at a third position in said orbit is a third particle density, said third particle density being less than said second particle density; and said method further comprises the step of decreasing said noise margin of said digital circuit as said spacecraft system travels from said second position to said third position.

11. A method as claimed in claim 8 wherein:

said spacecraft system comprises a voltage source for providing a voltage to said digital circuit;

said noise margin is responsive to said voltage; and said adjusting step alters said voltage.

12. A method as claimed in claim 11 wherein:

said digital circuit is a current steering logic (CSL) element; and said voltage is a current source bias voltage for said CSL element.

13. A method as claimed in claim 11 wherein:

said digital circuit is a complementary metal-oxide semiconductor (CMOS) element; and said voltage is a source voltage, said source voltage being configured to power said CMOS element.

14. A method as claimed in claim 8 wherein:

said noise margin is proportional to a power consumption level of said digital circuit; and said adjusting step alters said power consumption level.

15. A method as claimed in claim 14 wherein:

said determining step comprises the step of comparing a first value corresponding to said particle density with a threshold value corresponding to a predetermined particle density;

said adjusting step further comprises the step of increasing said power consumption level when said first value is greater than said threshold value; and said adjusting step further comprises the step of decreasing said power consumption level when said first value is less than said threshold value.

16. A method as claimed in claim 8 wherein:

said determining step comprises the step of comparing a first value corresponding to said particle density with a threshold value corresponding to a predetermined particle density;

said adjusting step increases said noise margin when said first value is greater than said threshold value; and said adjusting step decreases said noise margin when said first value is less than said threshold value.

17. A method as claimed in claim 8 wherein said orbit includes a plurality of positions, a first one of said positions has a first particle density, a second one of said positions has a second particle density, and said method further comprises the steps of:

storing a first value relative to said first position in a look-up table prior to said determining step, said first value being responsive to said first particle density;

storing a second value relative to said second position in said look-up table prior to said determining step, said second value being responsive to said second particle density; and accessing said look-up table in response to said determining step.

18. A method as claimed in claim 17 further comprising the step of providing a scaling factor for scaling said first and second values during the orbit of said spacecraft system.

19. A method as claimed in claim 17 additionally comprising the steps of:

performing said accessing step prior to the arrival of said spacecraft system to said first one of said positions; and repeating said accessing step prior to the arrival of said spacecraft system to said second one of said positions.

20. A method as claimed in claim 8 wherein said determining and adjusting steps are performed in response to a particle density estimation signal generated onboard said spacecraft system.

21. A method as claimed in claim 8 wherein said spacecraft system is configured to receive instructions for performing said adjusting step.

22. A method of operating a spacecraft system to dynamically harden a digital circuit to single event upsets, said digital circuit being located in said spacecraft system traveling in an orbit, and said digital circuit having a noise margin, said method comprising the steps of:

(a) determining a first particle density at a first position in said orbit;

(b) determining a second particle density at a second position in said orbit, said second particle density being unequal to said first particle density;

(c) adjusting said noise margin as said spacecraft system travels from said first position to said second position;

(d) determining a third particle density at a third position in said orbit, said third particle density being unequal to said second particle density; and (e) re-adjusting said noise margin as said spacecraft system travels from said second position to said third position.

23. A method as claimed in claim 22 wherein:

said second particle density is greater than said first particle density, and said step (c) increases said noise margin; and said third particle density is less than said second particle density, and said step (e) decreases said noise margin.

24. A method as claimed in claim 22 wherein said steps (a) through (e) are repeated as said spacecraft system repeats said orbit.

* * * * *